(12) United States Patent
Zhang et al.

(10) Patent No.: US 7,495,495 B2
(45) Date of Patent: Feb. 24, 2009

(54) DIGITAL I/O TIMING CONTROL

(75) Inventors: Fulong Zhang, Allentown, PA (US); Harold D. Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 315 days.

(21) Appl. No.: 11/281,651

(22) Filed: Nov. 17, 2005

(65) Prior Publication Data

US 2007/0109880 A1     May 17, 2007

(51) Int. Cl.
    *H03H 11/26*      (2006.01)
(52) U.S. Cl. .................. 327/276; 327/265; 327/273; 327/279; 327/286; 327/241
(58) Field of Classification Search .............. 365/194; 327/276, 265, 273, 279, 286, 241
    See application file for complete search history.

(56) References Cited

U.S. PATENT DOCUMENTS

| | | | |
|---|---|---|---|
| 5,883,534 A | 3/1999 | Kondoh et al. ............. 327/156 |
| 6,043,677 A | 3/2000 | Albu et al. .................. 326/39 |
| 6,160,755 A * | 12/2000 | Norman et al. ............. 365/233 |
| 6,194,928 B1 | 2/2001 | Heyne ........................ 327/152 |
| 6,252,443 B1 | 6/2001 | Dortu et al. ................. 327/156 |
| 6,414,521 B1 | 7/2002 | Potter et al. ................. 327/67 |
| 6,580,304 B1 * | 6/2003 | Rieven ....................... 327/276 |
| 6,657,467 B2 | 12/2003 | Seki et al. ................... 327/158 |
| 6,667,641 B1 * | 12/2003 | Wang et al. ................. 327/156 |
| 6,741,107 B2 | 5/2004 | Borkar et al. ............... 327/153 |
| 2002/0005741 A1 * | 1/2002 | Ikeda ......................... 327/160 |
| 2003/0001650 A1 | 1/2003 | Cao et al. ................... 327/277 |
| 2004/0239387 A1 | 12/2004 | Zhang et al. ............... 327/158 |

OTHER PUBLICATIONS

Written Opinion Of The International Searching Authority, mailed to applicants Jul. 2, 2008.

* cited by examiner

*Primary Examiner*—Tuan T Lam
*Assistant Examiner*—Daniel Rojas
(74) *Attorney, Agent, or Firm*—Mendelsohn & Associates, P.C.

(57) ABSTRACT

When certain digital circuit devices receive data bus signals, I/O interfaces need to sample the data signals during a time when these signals are both valid and stable. Typically, the data signals are sampled at a time corresponding to a point halfway between rising and falling edges of a reference clock signal associated with the data bus, which sampling time corresponds to a 90-degree phase shift of the reference clock signal. In one embodiment of the invention, a delay count generator determines a delay value corresponding to a quarter cycle (i.e., 90 degrees) of the reference clock signal. In making this determination, a counter counts the number of clock cycles of an internally generated, relatively high-frequency clock signal, where the number corresponds to a specified portion (e.g., one half) of a period of a divided-down version of the reference clock signal. That number can then be used to generate the 90-degree delay value.

20 Claims, 7 Drawing Sheets

DIGITAL I/O TIMING CONTROL

TECHNICAL FIELD

The present invention relates to input/output (I/O) data communication and, in particular, to generating a delayed clock signal for correctly sampling the data.

BACKGROUND

FIG. 1 illustrates a typical data bus interconnection scheme within a circuit 100. In circuit 100, digital circuit device 102 communicates via Data Bus A with a second digital circuit device 104. This data bus transmits one or more data signals from one digital circuit device to another digital circuit device. The plurality of data signals within Data Bus A may contain data corresponding to any digitally represented value used within these devices. For example, the data signals may contain 32 data bits, D0:D31, that correspond to a processing data path that passes between the devices. Alternatively or in addition, data signals may represent an address data value, Adr0:Adr31, that may be used to address a 32-bit address space. One skilled in the art will recognize that any number of bits may be carried by Data Bus A depending upon a particular application.

A separate clock signal, such as Clock A, is also passed between the digital circuit devices. Clock A provides a reference clock signal that may be used by digital circuit device 104 to sample the data signals transmitted over Data Bus A. Clock A is typically a periodic clock signal that operates at a pre-determined clock frequency that may be used throughout circuit 100. However, a reference clock signal associated with a particular data bus is typically provided for each data bus within circuit 100 to account for different propagation delays or signal latencies that may exist within the transmitting digital circuit devices. As such, Clock A and may differ in phase relative to other bus clock signals that may be present within circuit 100.

FIG. 2 illustrates a set of timing diagrams for Bus A data and Clock A as described above in reference to FIG. 1. Data signals within Data Bus A and Clock A are in phase with each other in that the signals present on Data Bus A may change state on either the rising edge or the falling edge of Clock A. When digital circuit device 104 receives Bus A data signals, I/O interfaces within digital circuit device 104 need to sample these data signals during a time when these signals are both valid and stable. The data signals on Data Bus A become valid and stable after time $T_0$, which corresponds to a rising edge of Clock A. These data signals on Data Bus A may become unstable and/or invalid at time $T_1$, which corresponds to a falling edge of Clock A. Since the data signals on Data Bus A are valid after $T_0$ and before $T_1$, the data signals may be safely sampled at time $T_{sample}$, which is a point in time between $T_0$ and $T_1$. Due to system noise, clock jitter, and skew between Clock A and all of the data signals, $T_{sample}$ should be separated from both $T_0$ and $T_1$. Typically, time $T_{sample}$ corresponds to a point halfway between $T_0$ and $T_1$ to maximize a setup-and-hold window. For a clock signal having a 50% duty cycle, time $T_{sample}$ corresponds to a 90-degree phase shift (i.e., a quarter of the period) of Clock A.

Delay-locked loop (DLL) circuits have been typically used to produce digital control signals that identify time $T_{sample}$ relative to the rising and falling edges of Clock A. These control signals are used by slave delay modules to correctly sample the data signals on Data Bus A. The DLL circuits typically require 4 different delay blocks to implement their functions. These DLL circuits may also suffer from instability issues related to phase comparisons performed on the clock signals. All of these characteristics render prior implementations of the timing control circuits as possibly operating problematically.

SUMMARY

In one embodiment, the present invention includes an apparatus for applying a desired phase shift to an input clock signal to generate a delayed clock signal. The apparatus comprises a delay count generator and a slave delay module. The delay count generator generates a delay count value corresponding to the desired phase shift, and the slave delay module delays the input clock signal based on the delay count value to generate the delayed clock signal. The delay count generator comprises a counter and control logic. The counter counts cycles of a high-frequency clock signal having a frequency greater than that of the input clock signal, and the control logic controls the counting operation of the counter based on the input clock signal to generate the delay count value.

In another embodiment, the present invention is a method and apparatus for applying a desired phase shift to an input clock signal to generate a delayed clock signal. A delay count value corresponding to the desired phase shift is generated, and the input clock signal is delayed based on the delay count value to generate the delayed clock signal. The delay count value is generated by (1) counting cycles of a high-frequency clock signal having a frequency greater than that of the input clock signal and (2) controlling the counting operation based on the input clock signal to generate the delay count value.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Figure 3:
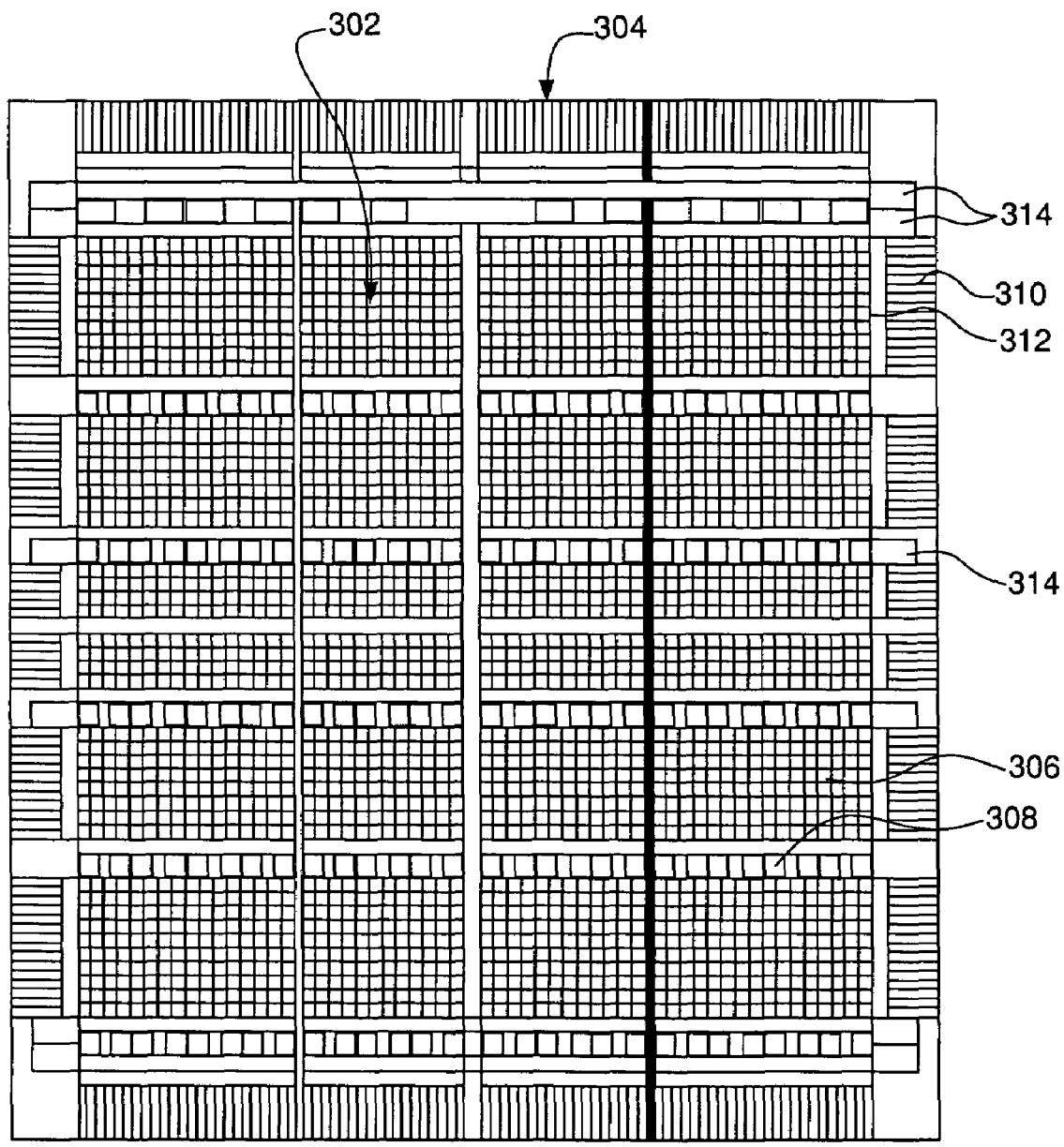
FIG. 3 represents the layout of an exemplary FPGA of the present invention.

FIG. 3 shows the layout of an exemplary FPGA 300 of the present invention, having a logic core 302 surrounded by an input/output (I/O) ring 304. Logic core 302 includes an array of programmable logic blocks (PLBs) 306 (also referred to in the art as programmable logic cells, logic array blocks, or configurable logic blocks) intersected by rows of block memory 308. Each PLB contains circuitry that can be programmed to perform a variety of different functions. The memory blocks in each row are available to store data to be input to the PLBs and/or data generated by the PLBs. I/O ring 304 includes sets of I/O buffers 310 programmably connected to the logic core by multiplexor/demultiplexor (mux/demux) circuits 312. The I/O buffers support external interfacing to FPGA 300. Also located within the I/O ring are a number of phase-locked loop (PLL) circuits 314 that are capable of providing different timing signals for use by the various elements within FPGA 300. Those skilled in the art will understand that FPGAs, such as FPGA 300, will typically include other elements, such as configuration memory, that are not shown in the high-level block diagram of FIG. 3. In addition, general routing resources, including clocks, buses, general-purpose routing, high-speed routing, etc. (also not shown in FIG. 3), are provided throughout the FPGA layout to programmably interconnect the various elements within FPGA 300.

The layout of an FPGA, such as FPGA 300 of FIG. 3, comprises multiple instances of a limited number of different types of blocks of circuitry. For example, an I/O ring may contain a number of instances of the same basic block of circuitry repeated around the periphery of the device. In the example of FPGA 300, I/O ring 304 is made up of multiple instances of the same basic programmable I/O circuit (PIC), where each PIC provides a particular number (e.g., three) of the I/O buffers of the I/O ring. Because FPGA 300 typically includes data bus interconnections with other digital circuit devices, FGPA 300 may also include DLL modules and other clock modules useful in phase-shifting bus clock signals to accurately sample data bus signals as discussed above.

Figure 4:
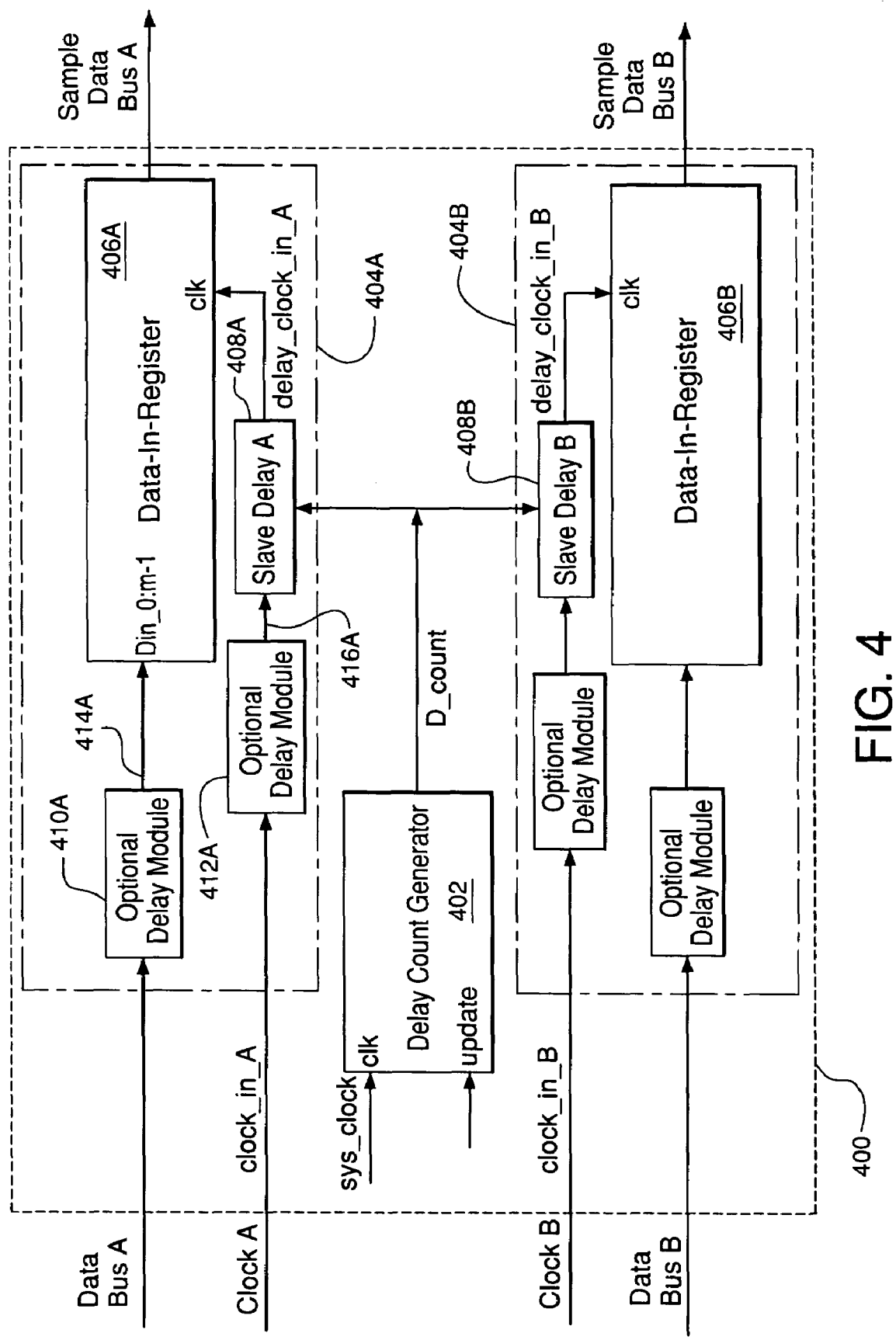
FIG. 4 illustrates a block diagram of a circuit that uses of a delay count generator to capture a set of data bus signals, according to one embodiment of the present invention.

FIG. 4 illustrates use of a delay count generator 402 to capture a set of data bus signals, according to one embodiment of the present invention. Data bus I/O interconnection circuit 400 of FIG. 4 illustrates two data bus interconnection modules 404A-B that may be used to provide a data bus I/O interconnection for two separate data buses. Data bus interconnection module 404A and data bus interconnection module 404B contain similar elements and operate in analogous manners to provide an I/O interconnection for their respective data buses, Data Bus A and Data Bus B. Data Bus A and Data Bus B operate at the same frequency, although each bus and associated clock signal might not be in phase with each other. Delay count generator 402 determines an amount of delay needed to be applied to the Clock A and Clock B signals to sample their respective data bus signals at a time $T_{sample}$ for each respective data bus. In alternative embodiments, delay count generator 402 may be used to provide the amount of delay to be applied to any number of bus clock signals, such as Clock A and Clock B, that operate at the same frequency.

Data bus interconnection module 404A may be constructed using data-in register 406A and slave delay module 408A. Similarly, data bus interconnection module 404B may be constructed using data-in register 406B and slave delay module 408B. Data-in register 406A is used to capture the data bus signals received from an external source such as another digital circuit device. Delay count generator 402 receives a sys_clock signal, such as Clock A associated with Data Bus A, and generates a D_count delay value corresponding to a time delay needed to sample the data bus signals at a desired time $T_{sample}$ relative to the rising and falling edges of Clock A. Alternatively, sys_clock signal may correspond to Clock B associated with Data Bus B or any other system clock signal having the same clock frequency as Clock A and Clock B. The amount of delay to be applied to the clock_in_A signal is encoded into D_count and passed by delay count generator 402 to slave delay module 408A. Slave delay module 408A receives the clock_in_A signal and generates a delayed_clock_in_A signal by delaying the clock_in_A signal's rising and falling edges by an amount of time corresponding to the D_count delay value.

The delayed_clock_in_A signal may be used to sample the data bus signals of Data Bus A in data-in register 406A. Data-in register 406A outputs a set of sampled data signals corresponding to Sampled Data Bus A for use within the digital circuit device. Data bus interconnection module 404A may also contain optional delay module 410A and/or optional delay module 412A to compensate for timing delays introduced by logic within slave delay module 408A. Optional delay module 410A may comprise a string of delay gates for each of the data signals of Data Bus A. The number of delay gates within these strings of delay gates produces a Delayed Data Bus 414A corresponding to data signals delayed by the number of gate delays introduced by the string of delay gates. Any suitable number of delay gates may be included within each string of delay gates to provide a time delay needed to compensate for the timing delays introduced by logic within slave delay module 408A.

Similarly, optional delay module 412A may be utilized to generate a compensated clock_in_A signal 416A that also may be used to eliminate timing delays introduced by logic within slave delay module 408A. While optional delay module 410A adds a time delay to each of the data signals of Data Bus A, optional delay module 412A adds a time delay to clock_in_A signal. These two optional time delays alter the relative time relationship between data signals of Data Bus A and the delayed_clock_in_A signal used to sample these data signals in data-in register 406A. Because slave delay module 408A generates the delayed_clock_in signal, which defines the relative time relationship between data signals of Data Bus A and the delayed_clock_in_A signal, use of either or both of these optional delay modules 410A, 412A may be useful to provide a particular relative time delay between data signals of Data Bus A and the delayed_clock_in_A signal to compensate for timing delays introduced by slave delay module 408A.

One possible embodiment for slave delay module 408A contains a string of delay gates, each of which delays clock_in signal by a fixed gate delay. D_count value may represent a number of gate delays to be applied to clock_in to generate delayed_clock_in_A. Slave delay module 408A may contain logic to select a particular delayed clock signal from a plurality of delayed clock signals generated within the string of delay gates. For example, slave delay module 408A may contain a string of 256 delay gates that delays clock_in by a total of 256 gate delays. At each delay gate within the string of 256 delay gates, a delayed clock signal is generated corresponding to the number of delay gates between the input to the string of delay gates and the particular delay gate. Logic within slave delay module 408A selects the particular delayed_clock_in signal based upon the value specified within D_count. One such embodiment of a slave delay module is disclosed in detail within commonly assigned U.S. Patent Application No. US2004/0239387 by Zhang et al., entitled "Digitally Controlled Delay Cells," filed May 28, 2003, which is incorporated by reference herein in its entirety.

Data bus interconnection module 404B operates in an analogous manner to data bus interconnection module 404A. The amount of delay encoded into D_count is applied to clock_in_B to sample the data bus signals of Data Bus B into data-in register 406B. Because Clock B is used to generate the delayed_clock_in_B signal, the data signals of Data Bus B may be correctly sampled based upon the proper relationship of Data Bus B and Clock B. Each of the data bus interconnection modules 404A-B utilize D_count to delay the incoming bus clock signal in a similar manner even though each data bus interconnection module may not operate in phase with each other.

Figure 1:
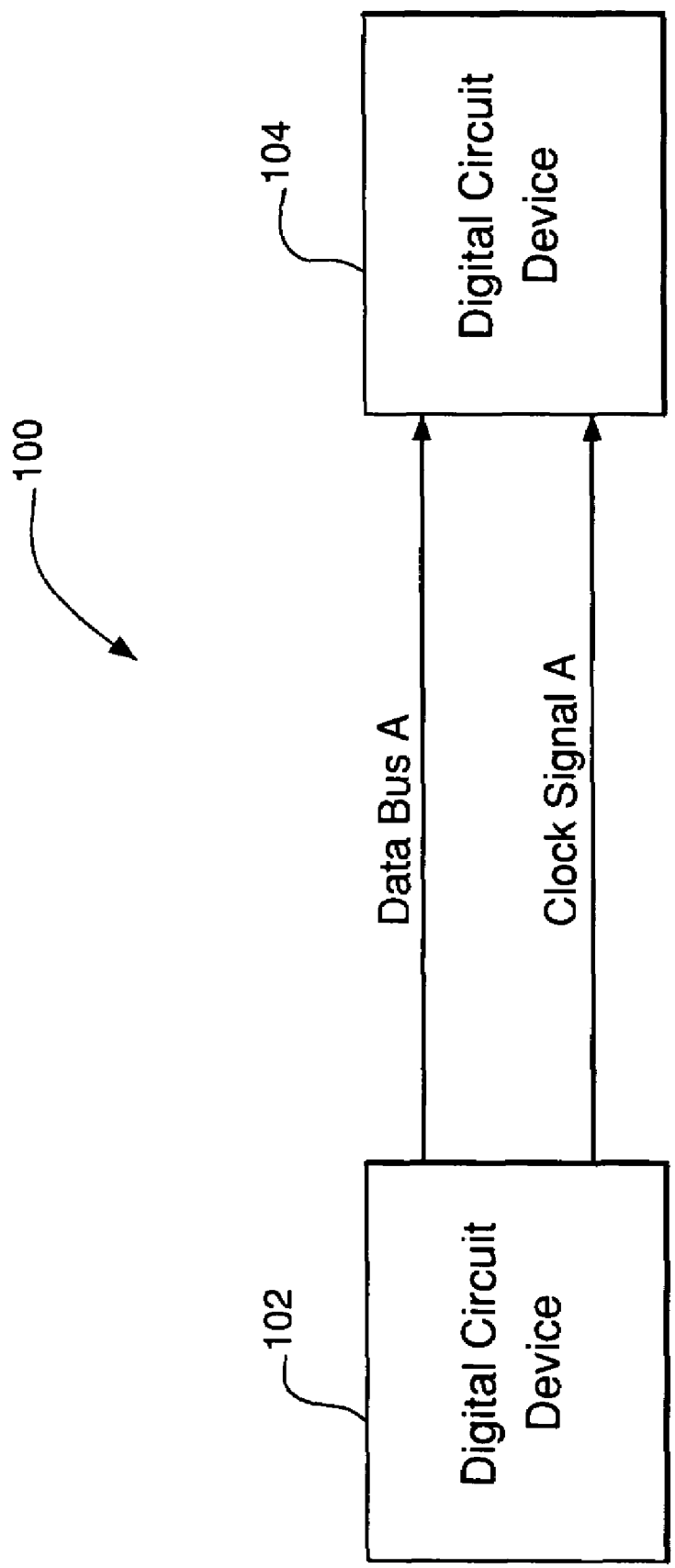
FIG. 1 illustrates a block diagram of a typical data bus interconnection scheme for two digital circuit devices.
Figure 2:
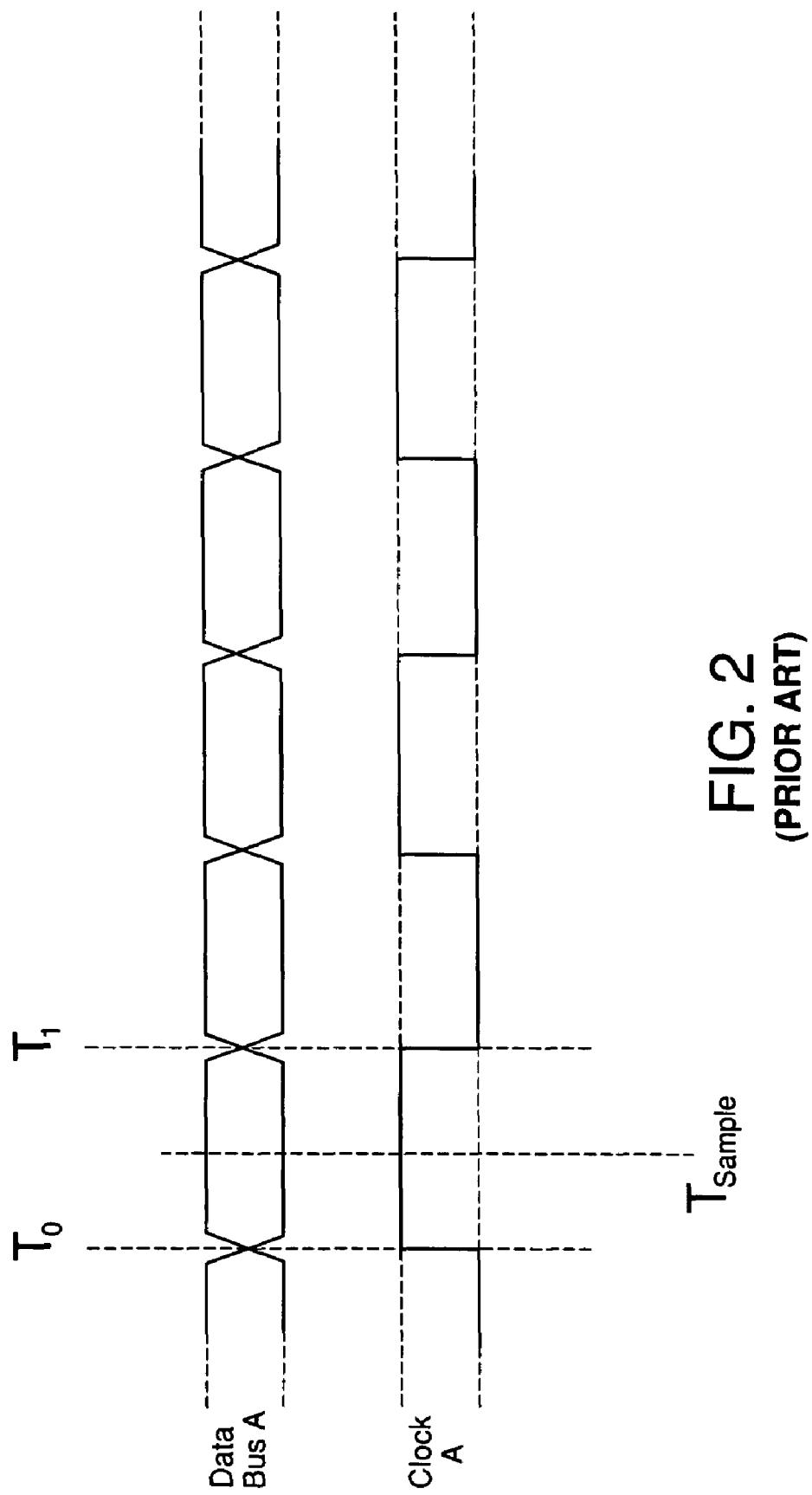
FIG. 2 illustrates a timing diagram for I/O operation of the typical data bus of FIG. 1.
Figure 5:
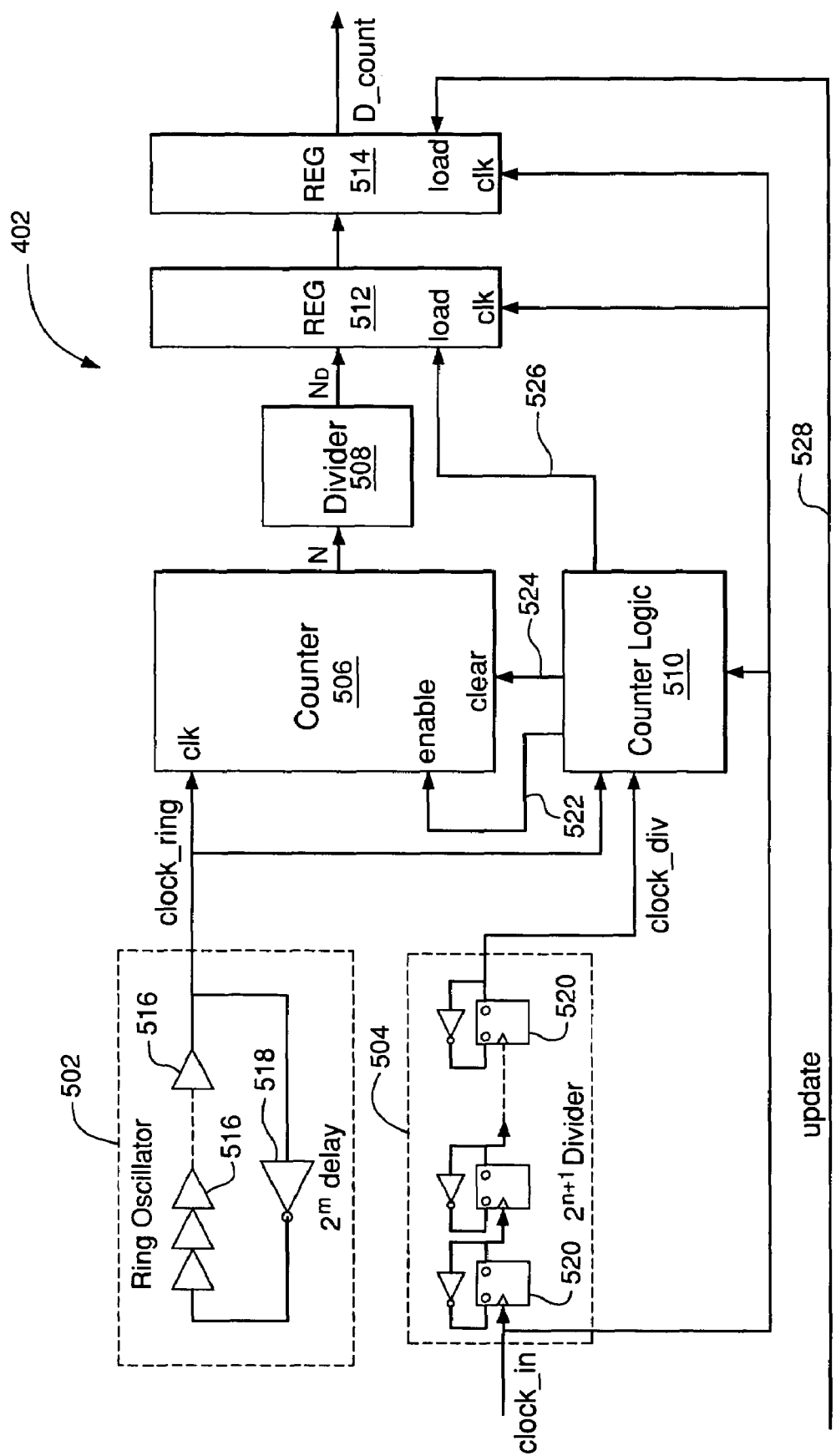
FIG. 5 illustrates a block diagram of the delay count generator of FIG. 4, according to one embodiment of the present invention.

FIG. 5 illustrates delay count generator 402 of FIG. 4, according to one embodiment of the present invention. Delay count generator 402 includes ring oscillator 502, clock divider 504, counter 506, divider module 508, control logic module 510, and a pair of output registers 512 and 514. Delay count generator 402 determines the delay value D_count corresponding to a portion of the period for clock_in signal needed to define time $T_{sample}$, for example, 90 degrees. In making this determination, clock divider 504 generates a divided-down version (clock_div) of clock_in, and counter 506 counts a number N of clock cycles of a relatively high-frequency reference clock signal, clock_ring, generated by ring oscillator 502, where N corresponds to the number of clock cycles of clock_ring in a specified portion (e.g., a half cycle) of clock_div. From count N, a delay value $N_D$ representing the number of clock_ring cycles needed to generate a desired delay, or phase shift, of clock_in signal, may be determined. The desired delay may correspond to an amount of delay applied to clock_in signal to permit a delayed_clock_in signal to sample data signals of Data Bus A at time $T_{sample}$, as discussed above in reference to FIGS. 2 and 4.

Ring oscillator 502 comprises a string of delay gates 516 and an inverter 518. By inverting the output from the last delay gate and feeding this inverted signal back to the input of the first delay gate, ring oscillator 502 will oscillate and create the clock_ring signal with a period $T_{ring}$ equal to the total delay of ring oscillator 502, according to Equation (1):

$$T_{ring}=2^m*\text{del} \qquad (1)$$

where del corresponds to the signal delay of each of the $2^m$ delay elements in ring oscillator 502, and m is an integer. In one possible implementation, the delay of inverter 518 is designed to closely match the delay of each delay gate 516. In that case, ring oscillator would contain inverter 518 and $2^m-1$ delay gates 516. Alternatively, inverter 518 can be designed to be much faster than each delay gate 516. In that case, ring oscillator 502 can be implemented using $2^m$ delay gates 516, where the extra delay from inverter 518 results in a relatively small phase error. For example, if m=7 and the delay of inverter 518 is ¼ the delay of each delay gate 516, then the phase error will be $1/(3*2^7)$ or less than 0.3%.

Clock divider module 504 generates a lower-frequency clock signal, clock_div, that corresponds to a divided-down version of the clock_in signal. Using (n+1) toggle flip-flops 520, the clock_in signal is divided down according to Equation (2):

$$T_{div}=2^{(n+1)}*T_{in} \qquad (2)$$

where $T_{in}$ is the period of the clock_in signal and $T_{div}$ is the period of the clock_div signal.

Counter 506 increments its count once at each rising edge of the clock_ring signal. Counter 506 is enabled and cleared by control signals 522 and 524, respectively, generated by control logic module 510 based upon the clock_div signal. To ensure proper operation, signal 522 should be synchronized to the clock_ring signal within counter 506 so that all of the registers within counter 506 are enabled/disabled during the same clock_ring cycle.

Figure 6:
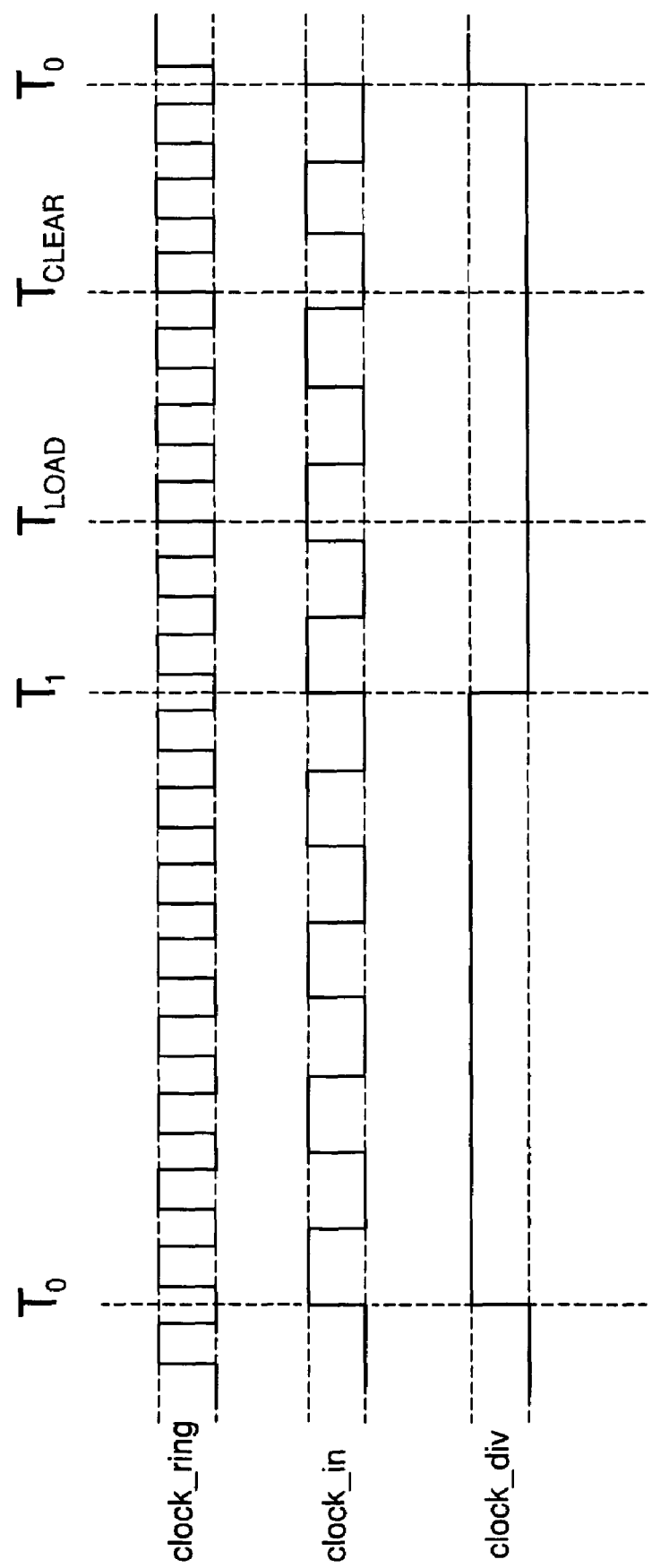
FIG. 6 is a timing diagram corresponding to the clock signals within the delay count generator of FIG. 5.

FIG. 6 illustrates a timing diagram corresponding to exemplary clock signals within FIG. 5. In the example of FIG. 6, clock_in has been divided-down by a factor of eight using three toggle flip-flops in clock divider 504 to generate clock_div. The use of a slower clock_div signal permits counter 506 to count a larger value for count N over multiple time periods of the clock_in signal. This longer clock_div cycle assists in obtaining a desired level of accuracy for count value N, and thus delay value $N_D$ by reducing the effects of jitter in the clock_in signal. Using more toggle flip-flops within clock divider 504 generates a longer cycle for clock_div and, therefore, a more accurate count value $N_D$. On the other hand, using a longer clock cycle increases the time that it takes to generate the final result.

In one implementation, control logic module 510 uses the divided-down clock signal clock_div as enable signal 522. In that case, counter 506 will count the number of rising edges in clock_ring between time $T_0$ and time $T_1$ in FIG. 6 (i.e., 8 rising edges, in this particular example), corresponding to one-half cycle of clock_div. For this particular implementation, Equation (3) represents the relationship between the N cycles of clock_ring and the ½ cycle of clock_div as follows:

$$N*T_{ring}=T_{div}/2 \qquad (3)$$

Substituting Equations (1) and (2) into Equation (3) yields Equation (4) as follows:

$$N*2^m*\text{del}=2^n*T_{in}. \qquad (4)$$

As noted above in reference to FIG. 2, a quarter-cycle delay for clock_in signal (i.e., a 90-degree phase shift) may be useful in accurately sampling the plurality of data bus signals. $T_{in}/4$, which corresponds to the quarter-cycle delay, may be derived from Equation (4) as follows:

$$T_{in}/4 = \left(\frac{N*\text{del}}{2^{(n+2-m)}}\right) \qquad (5)$$

As such, the number of cycles ($N_D$) of clock_ring corresponding to a quarter cycle of clock_in is given by Equation (6) as follows:

$$N_D = \left(\frac{N}{2^{(n+2-m)}}\right) \qquad (6)$$

As indicated by Equation (6), deriving delay value $N_D$ from count value N corresponds to a right shift of count N by (n+2−m) bits, as implemented by divider 508. This right-shifted value corresponds to the value $N_D$ generated by divider module 508 and provided to register 512. Alternatively, divider 508 can be eliminated by simply ignoring the (n+2−m) least significant bits within counter 506 when providing delay value $N_D$ to register 512. $N_D$ corresponds to a number of clock_ring cycles that clock_in signal may be delayed to obtain a 90-degree phase shift.

When slave delay module 408 of FIG. 4 is implemented using delay gates that each apply the same amount of delay as each delay gate 516 of ring oscillator 502, $N_D$ is the delay value D_count passed by delay count generator 402 to slave delay module 408. If the delay gates in ring oscillator 502 and those in slave delay module 408 apply different delay amounts, then the value $N_D$ would be adjusted according to the ratio of those different delay amounts to generate the value D_count.

In an alternative implementation, ring oscillator 502 has M delay elements, where M is not an integer power of 2. In that case, D_count($T_{in}$/4) corresponds to:

$$D\_count(T_{in}/4) = \left(\frac{N*M}{2^{(n+2)}}\right). \quad (7)$$

Multiplying by M is more expensive in terms of the complexity, power, and area needed to implement delay count generator 402 if M is not in the form of $2^m$. Performing a multiply and/or a divide operation to determine D_count(T/4) requires divider 508 to include hardware components to perform these operations.

The final digital control signals used within delay count generator 402 are load control signals 526 and 528 applied to registers 512 and 514, respectively. Register 512 is used to latch the delay value $N_D$ after counter 506 stops counting at time $T_1$ of FIG. 6. Control logic 510 generates load control signal 526 at time $T_{load}$ to store the delay value $N_D$ into register 512. $T_{load}$ occurs after counter 506 finishes counting and the result settles. In the exemplary implementation of FIG. 6, control logic 510 asserts load control signal 526 at the third rising edge of clock_ring following each falling edge of clock_div. Other implementations are possible.

After the delay value $N_D$ has been loaded into register 512, control logic 510 generates clear control signal 524 at time $T_{clear}$ to reset counter 506 to zero before counter 506 begins counting again at the rising edge of the next clock_div cycle. In the exemplary implementation of FIG. 6, control logic 510 asserts clear control signal 524 at the sixth rising edge of clock_ring following each falling edge of clock_div. Other implementations are possible.

Once the delay value $N_D$ is stored within register 512, the delay value $N_D$ is loaded into register 514 for use as D_count by slave delay module 408 by asserting load control signal 528, which, in this particular implementation, is generated by circuitry external to delay count generator 402. The two-stage approach using registers 512 and 514 reduces a minimum pulse period required for load control signal 528. The minimum pulse period for load control signal 528 is only one clock_in cycle, which allows a user to update D_count in small idle or write time windows within the operation of digital circuit device 104 of FIG. A. Without this 2-stage solution, load control signal 528 might need to be held high for an entire clock_div cycle, which may create other difficulties associated with the operation of slave delay module 408. In addition, the two-stage approach of FIG. 5 enables D_count in register 514 to be updated less frequently than the count value $N_D$ in register 512, thereby providing the ability to control when the amount of delay used by slave delay module 408 is changed.

Consideration may need to be taken in the design of delay count generator 402 to minimize any timing delay offset introduced by multiplexers that may be present within slave delay module 408. One technique would be to produce identical dummy multiplexer offset delays in the clock signal path if the delays in the data paths are controlled by digital controls. This delay may be introduced by optional delay module 412 of FIG. 4. Alternatively, use of dummy offset delays generated by optional delay module 410 in the data paths yields a similar result. This matching of offset delays should be easy to achieve if delay blocks are in both the clock and data paths, which is true for most FPGA device families because clock and data signal paths typically utilize identical general-purpose programmable I/O logic cells. By compensating for offset delays, the proportional relationship between 90-degree slave delay module 408 and any other slave delay modules can be achieved.

Figure 7:
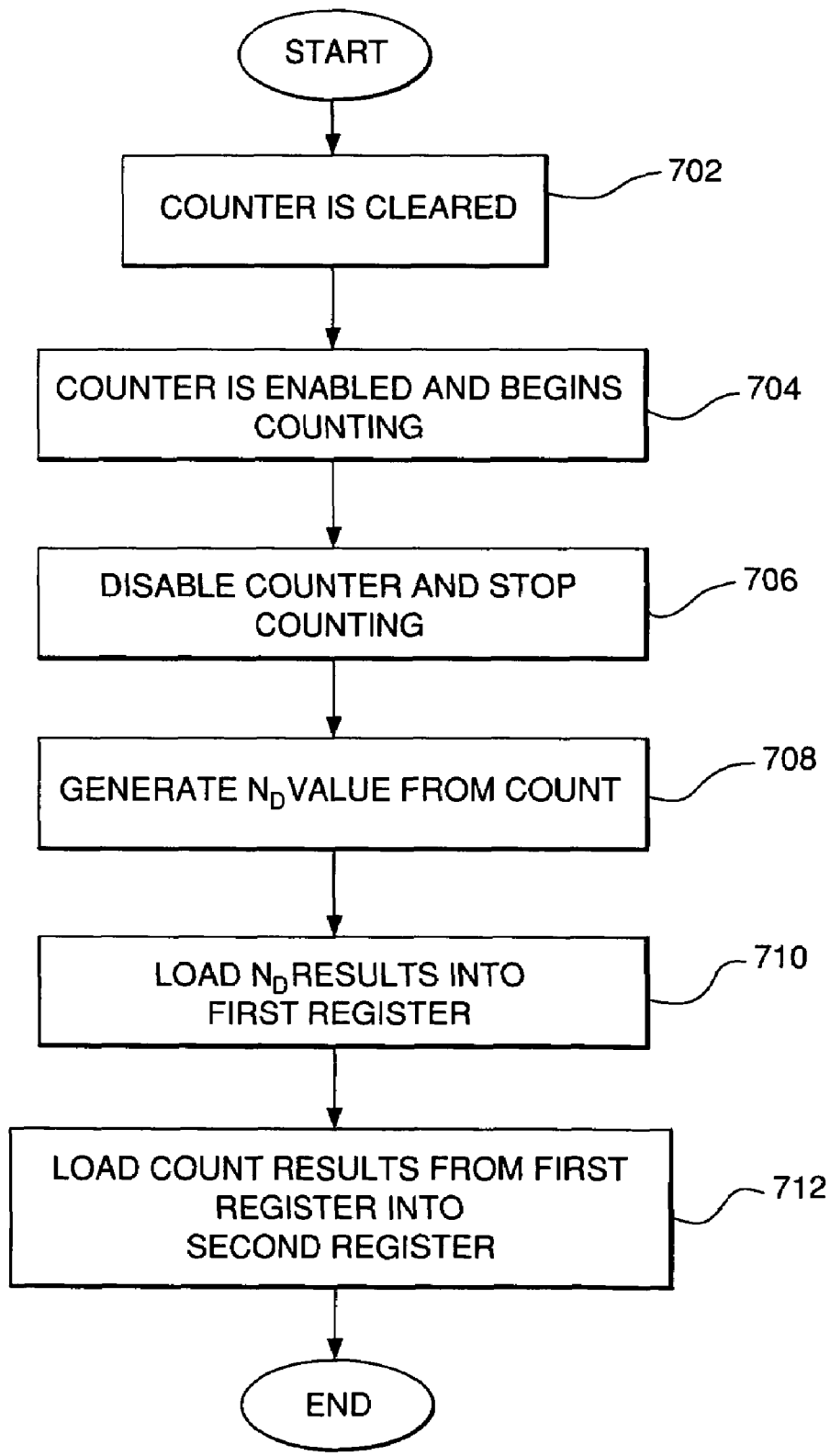
FIG. 7 illustrates a flowchart for the operation of the delay count generator of FIG. 5, according to one embodiment of the present invention.

FIG. 7 illustrates a flowchart for the operations of delay count generator 402 of FIG. 5, according to one embodiment of the present invention. Delay count generator 402 performs the following operations:

1. Control logic module 510 clears counter 506 at time $T_{clear}$ (e.g., prior to time $T_0$ in FIG. 6) (step 702 of FIG. 7);
2. Control logic module 510 enables counter 506 to count for the duration of one half cycle of the clock_div signal (step 704);
3. Control logic module 510 stops counter 506 at time $T_1$ (step 706);
4. Divider module 508 generates delay value $N_D$ from count N (step 708);
5. Control logic module 510 loads $N_D$ delay value into register 512 at time $T_{load}$ (step 710); and
6. Update load control signal 528 causes register 514 to load the value from register 512 (step 712).

The present invention has been described in the context of delay count generator 402, which uses ring oscillator 502 and clock divider 504 to generate the relatively high-frequency clock_ring and relatively low-frequency clock_div signals used by control logic 510 and counter 506 to count the number of cycles of clock_ring corresponding to a half cycle of clock_div in order to determine a delay value $N_D$ corresponding to a 90-degree phase shift of the clock_in signal. The invention is not so limited. Alternative embodiments may be implemented with one or more of the following:

- Circuitry other than a ring oscillator to generate a relatively high-frequency clock signal used to increment counter 506, such as a voltage-controlled oscillator (VCO) or a current-controlled oscillator (CCO).
- Circuitry other than the string of flip-flops in clock divider 504 to generate a relatively low-frequency clock signal from clock_in, such as a counter or a divider circuit. Note that clock divider 504 may be omitted if the period of clock_in is sufficiently long to satisfy the accuracy requirements for a particular application or if control logic module 510 is designed to assert enable control signal 522 for a specified number of cycles of clock_in.
- Circuitry designed to count the number of cycles of clock_ring over a portion of a period of clock_div other than one half, such as over one complete period.
- Circuitry designed to generate a delay value $N_D$ corresponding to a portion of clock_in other than one quarter cycle.

Furthermore, in the exemplary implementation represented in FIG. 6, clock_div is eight times slower than clock_in, and clock_ring is two times faster than clock_in, such that counter 506 counts eight rising edges of clock_ring in one half period of clock_div. In alternative implementations, the relatively frequencies of the clock signals may be different from these values. In a typical real-world implementation, clock_div is about $2 \cdot 10^3$ to $2 \cdot 10^6$ times slower than clock_in, and clock_ring is approximately the same frequency as clock_in, such that counter 506 would count about $10^3$ to $10^6$ edges of clock_ring in one half period of clock_div. In a exemplary implementation having 128 50-ps delay elements in ring oscillator 502 and a clock_in speed of 200 MHz, clock_ring will have a period of 6.4 ns, and the period of clock_in will be 5 ns.

Although the invention has been described in the context of circuitry triggered by rising edges in clock signals, alternative embodiments may be triggered by falling clock edges.

Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. Apparatus for applying a desired phase shift to an input clock signal to generate a delayed clock signal, the apparatus comprising:
   a delay count generator adapted to generate a delay count value corresponding to the desired phase shift; and
   a slave delay module adapted to delay the input clock signal based on the delay count value to generate the delayed clock signal, wherein the delay count generator comprises:
      a counter adapted to count cycles of a high-frequency clock signal having a frequency greater than that of the input clock signal; and
      control logic adapted to control the counting operation of the counter based on the input clock signal to generate the delay count value.

2. The apparatus of claim 1, wherein the delay count generator further comprises circuitry adapted to generate the high-frequency clock signal.

3. The apparatus of claim 2, wherein the circuitry is a ring oscillator.

4. The apparatus of claim 1, wherein:
   the delay count generator further comprises a clock divider adapted to generate a divided-down version of the input clock signal; and
   the control logic is adapted to control the counting operation of the counter based on the divided-down clock signal to generate the delay count value.

5. The apparatus of claim 4, wherein the control logic is adapted to apply the divided-down clock signal as an enable signal for the counter, such that the counter is enabled for a half cycle of the divided-down clock signal.

6. The apparatus of claim 1, wherein the slave delay module comprises a string of delay elements and is adapted to select an output of a delay element in the string corresponding to the delay count value.

7. The apparatus of claim 6, wherein each delay element in the slave delay module applies an amount of delay equivalent to the period of the high-frequency clock signal.

8. The apparatus of claim 1, wherein the delay count generator further comprises:
   a first register adapted to store a value based on a counter value generated by the counter; and
   a second register adapted to store the value stored in the first register, wherein:
      the value is loaded into the first register based on a first load control signal generated by the control logic; and
      the value is loaded into the second register based on an externally generated second load control signal.

9. The apparatus of claim 1, wherein the apparatus is implemented in a single integrated circuit.

10. The apparatus of claim 9, wherein the single integrated circuit is an FPGA.

11. The apparatus of claim 1, wherein:
   the delay count generator further comprises:
      circuitry adapted to generate the high-frequency clock signal;
      a clock divider adapted to generate a divided-down version of the input clock signal;
      a first register adapted to store a value based on a counter value generated by the counter; and
      a second register adapted to store the value stored in the first register, wherein:
         the value is loaded into the first register based on a first load control signal generated by the control logic; and
         the value is loaded into the second register based on an externally generated second load control signal;
   the control logic is adapted to control the counting operation of the counter based on the divided-down clock signal to generate the delay count value;
   the slave delay module comprises a string of delay elements and is adapted to select an output of a delay element in the string corresponding to the delay count value; and
   the apparatus is implemented in a single integrated circuit.

12. The apparatus of claim 11, wherein:
the circuitry is a ring oscillator;
the control logic is adapted to apply the divided-down clock signal as an enable signal for the counter, such that the counter is enabled for a half cycle of the divided-down clock signal;
each delay element in the slave delay module applies an amount of delay equivalent to the period of the high-frequency clock signal; and
the single integrated circuit is an FPGA.

13. A method for applying a desired phase shift to an input clock signal to generate a delayed clock signal, the method comprising:
generating a delay count value corresponding to the desired phase shift; and
delaying the input clock signal based on the delay count value to generate the delayed clock signal, wherein the delay count value is generated by:
counting cycles of a high-frequency clock signal having a frequency greater than that of the input clock signal; and
controlling the counting operation based on the input clock signal to generate the delay count value.

14. The method of claim 13, further comprising generating the high-frequency clock signal.

15. The method of claim 13, further comprising generating a divided-down version of the input clock signal, wherein the counting operation is controlled based on the divided-down clock signal to generate the delay count value.

16. The method of claim 13, further comprising:
storing in a first register a value based on a counter value generated by the counting operation; and
storing in a second register the value stored in the first register, wherein:
the value is loaded into the first register based on a locally generated first load control signal; and
the value is loaded into the second register based on an externally generated second load control signal.

17. The method of claim 13, wherein the method is implemented in an FPGA.

18. The method of claim 13, further comprising:
generating the high-frequency clock signal;
generating a divided-down version of the input clock signal, wherein the counting operation is controlled based on the divided-down clock signal to generate the delay count value;
storing in a first register a value based on a counter value generated by the counting operation; and
storing in a second register the value stored in the first register, wherein:
the value is loaded into the first register based on a locally generated first load control signal; and
the value is loaded into the second register based on an externally generated second load control signal, wherein the method is implemented in a single integrated circuit.

19. The method of claim 18, wherein the single integrated circuit is an FPGA.

20. An apparatus for applying a desired phase shift to an input clock signal to generate a delayed clock signal, the apparatus comprising:
means for generating a delay count value corresponding to the desired phase shift; and
means for delaying the input clock signal based on the delay count value to generate the delayed clock signal, wherein the delay count value is generated by:
means for counting cycles of a high-frequency clock signal having a frequency greater than that of the input clock signal; and
means for controlling the counting operation based on the input clock signal to generate the delay count value.

* * * * *